United States Patent
Ichikawa

(10) Patent No.: US 8,347,719 B2
(45) Date of Patent: Jan. 8, 2013

(54) PIEZOELECTRIC FRAME AND PIEZOELECTRIC DEVICE INCORPORATING SAME

(75) Inventor: Ryoichi Ichikawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 416 days.

(21) Appl. No.: 12/637,374

(22) Filed: Dec. 14, 2009

(65) Prior Publication Data

US 2010/0147074 A1   Jun. 17, 2010

(30) Foreign Application Priority Data

Dec. 17, 2008 (JP) .................................. 2008-321002

(51) Int. Cl.
*G01C 19/56* (2006.01)
*H04R 17/00* (2006.01)
(52) U.S. Cl. .................................. 73/504.16; 29/25.35
(58) Field of Classification Search ................ 73/504.16
See application file for complete search history.

(56) References Cited

U.S. PATENT DOCUMENTS

2006/0202591 A1 * 9/2006 Inaguma et al. ............... 310/348
2009/0174286 A1 * 7/2009 Yoshimatsu et al. .......... 310/321

FOREIGN PATENT DOCUMENTS

| JP | 09-238041 | 9/1997 |
| JP | 09-238041 A | 9/1997 |
| JP | 2004-072609 A | 3/2004 |
| JP | 2004-208237 A | 7/2004 |
| JP | 2007-096900 A | 4/2007 |
| JP | 2007-311913 A | 11/2007 |

* cited by examiner

*Primary Examiner* — Hezron E Williams
*Assistant Examiner* — Gregory J Redmann
(74) *Attorney, Agent, or Firm* — Alix, Yale & Ristas, LLP

(57) ABSTRACT

A piezoelectric frame (20) is comprised of a tuning-fork type piezoelectric vibrating piece (30) having a pair of vibrating arms (21) extending from a base portion (23) wherein excitation electrodes are formed on the vibrating arms, an outer frame (22) surrounding the tuning-fork type piezoelectric vibrating piece, a pair of supporting arms (26) extending from the base portion to the outer frame portion and supporting the tuning-fork type piezoelectric vibrating piece; and an acute angle portion (11) formed on a side surface between the outer frame and the tuning-fork type piezoelectric vibrating piece and having an acute angle seen from Z-direction.

2 Claims, 13 Drawing Sheets

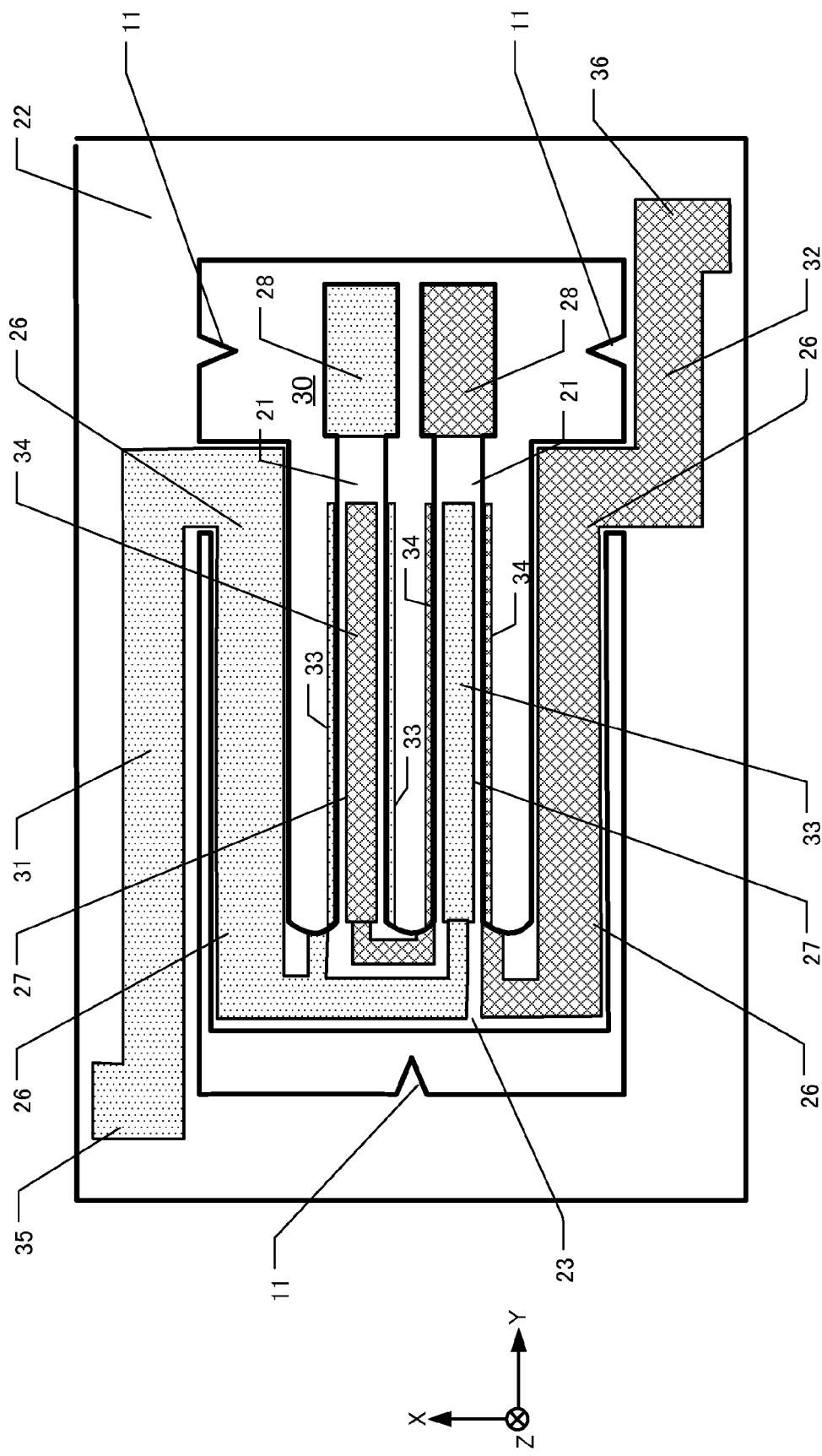

PIEZOELECTRIC FRAME AND PIEZOELECTRIC DEVICE INCORPORATING SAME

CROSS-REFERENCE TO RELATED APPLICATION

This application claims priority to and the benefit of Japan Patent Application No. 2008-321002, filed on Dec. 17, 2008, in the Japan Patent Office, the disclosure of which is incorporated herein by reference in its entirety.

FIELD

The present disclosure relates to a piezoelectric frame and methods of manufacturing piezoelectric frames having a reduced likelihood of short circuit failure.

DESCRIPTION OF THE RELATED ART

Piezoelectric (crystal) vibrating devices used for mobile communication device and/or OA equipment must be increasingly miniaturized and/or provided with a thin profile or high frequency capability so as to be correspondingly accommodated in electronic devices that likewise are miniaturized. Also, surface mount (SMD: surface mount device) piezoelectric vibrating elements that can be mounted on a circuit board are required.

With miniaturization of piezoelectric vibrating pieces, spaces between conductive elements at some areas may be less than 10 µm. When forming connecting terminals for a piezoelectric vibrating piece and forming electrical conductors on side surfaces of a piezoelectric vibrating piece, misalignment of a mask or flowing of deposition metal may happen. As a result, unwanted metal adheres to areas of the connecting terminals and it may cause short-circuit. Also, spaces between adjacent side surfaces of a base portion, side surfaces of a frame, and side surfaces of a piezoelectric vibrating piece are narrow because of miniaturization, so that exposure of photoresist material can be incomplete. This can also result in unwanted remains of metal film which can cause short-circuits. In this way, short-circuits caused by remaining metal film on side surfaces of structures in a miniaturized piezoelectric vibrating device are a typical cause of product failure.

According to Japan Unexamined Patent Application No. 09-238041, projection portions are formed as a profile of a piezoelectric vibrating piece is formed, and the projection portions are cut and removed to prevent short-circuit after forming electrodes or connecting wirings by deposition.

However, with a method disclosed in '238041 reference, cutting and removing of the projection portions is an extra step. Also, this cutting process requires detail-related work so that can slow mass production or increase the costs of production.

An objective of the disclosure is to provide piezoelectric frames or piezoelectric devices and manufacturing methods thereof that can prevent short-circuits without including the step of cutting and removing of the projection.

SUMMARY

A piezoelectric frame of first aspect is comprised of a tuning-fork type piezoelectric vibrating piece having a pair of vibrating arms extending from the base portion wherein excitation electrodes are formed on the vibrating arms, an outer frame surrounding the tuning-fork type piezoelectric vibrating piece, a pair of supporting arms extending from the base portion to the outer frame portion and supporting the tuning-fork type piezoelectric vibrating piece and an acute angle portion formed on a side surface between the outer frame and the tuning-fork type piezoelectric vibrating piece and having an acute angle seen from Z-direction. The Z-direction is a direction perpendicular to a plane including the frame and tuning-fork type piezoelectric vibrating piece.

According to the above-mentioned configuration, an acute angle portion is formed between the outer frame portion and the tuning-fork type piezoelectric vibrating piece. The acute angle portion reflects exposing light vertically coming in Z-direction for forming electrodes. Thus, when the electrodes are formed, exposing light is sufficiently irradiated to the side surface where the photoresist film is applied. Then the electrode films formed on the side surfaces of the acute angle portion and piezoelectric frame are removed by etching and the electrode patterns formed thereby are not prone to short-circuit.

According to a second aspect of the disclosure, the acute angle portion of the piezoelectric frame includes a first acute angle portion formed on the side surface of the outer frame portion facing the tuning-fork type piezoelectric vibrating piece.

According to a third aspect of the disclosure, the acute angle portion of the piezoelectric frame includes a second acute angle portion formed on the side surface of the base portion facing the outer frame portion.

According to a fourth aspect of the disclosure, the acute angle portion of the piezoelectric frame includes a third acute angle portion formed on the side surface of the supporting arm facing the outer frame portion.

By forming acute angle portions at a plurality of regions, exposing light is sufficiently irradiated to the photoresist film applied on the side surface of the piezoelectric frame when electrodes are formed and electrode films on the side surfaces of the acute angle and the piezoelectric frame are removed by etching.

A piezoelectric device according to a fifth aspect of the disclosure is comprised of the piezoelectric frame of any of preceding aspects, a lid covering the piezoelectric frame, a base supporting the piezoelectric frame and electrically connecting to an external electrode extending from the excitation electrode to the outer frame portion through the supporting arms.

By using the above-mentioned piezoelectric frame, piezoelectric devices having less failure caused by short-circuiting of electrodes can be provided.

A piezoelectric frame is comprised of a tuning-fork type piezoelectric vibrating piece having a pair of vibrating arms extending from a base portion, an outer frame surrounding the tuning-fork type piezoelectric vibrating piece, and a pair of supporting arms extending from the base portion to the outer frame portion and supporting the tuning-fork type piezoelectric vibrating piece. A manufacturing method of the piezoelectric frames according to a sixth aspect of the disclosure is comprised of, step of forming a resist film on substrate board; first exposing step of exposing of the substrate board by a mask having a region corresponding to the tuning-fork piezoelectric vibrating piece and another region corresponding to an acute angle portion having an acute angle when it is seen from Z-direction formed on the side surface between the tuning-fork type piezoelectric vibrating piece and the outer frame portion; and step of etching the substrate board exposed in the first exposing step.

According to the above-mentioned configuration, an acute angle portion is formed between the outer frame and the tuning-fork type piezoelectric vibrating piece. The acute angle portion reflects exposing light vertically coming in Z-direction for forming electrodes. Thus, when the electrodes are formed, exposing light is sufficiently irradiated to the side surface of the tuning-fork type piezoelectric vibrating piece where the photoresist film is applied.

The manufacturing method of piezoelectric frame according to a seventh aspect is comprised of a second exposing step of exposing of a substrate base on which the resist film is formed by using a mask for grooves having a region corresponding to the grooves on the vibrating arms and the acute angle portion, and half etching step of etching the substrate base halfway which exposed in the second exposing step.

After the second exposing step, the acute angle portion having complicated shape is formed. Thus, irradiated exposing light vertically coming from Z-direction to the side surface of the piezoelectric frame can be reflected to many directions.

Piezoelectric devices constructed according to the present disclosure prevent failures caused by short-circuiting of piezoelectric frames or devices induced by the remainder of metal film due to insufficient exposure to light during processing, eliminating the need for physical removal of metal film.

BRIEF DESCRIPTION OF THE DRAWINGS

FIG. 2 is a top view of a first crystal frame 20.

DETAILED DESCRIPTION

Figure 1A:
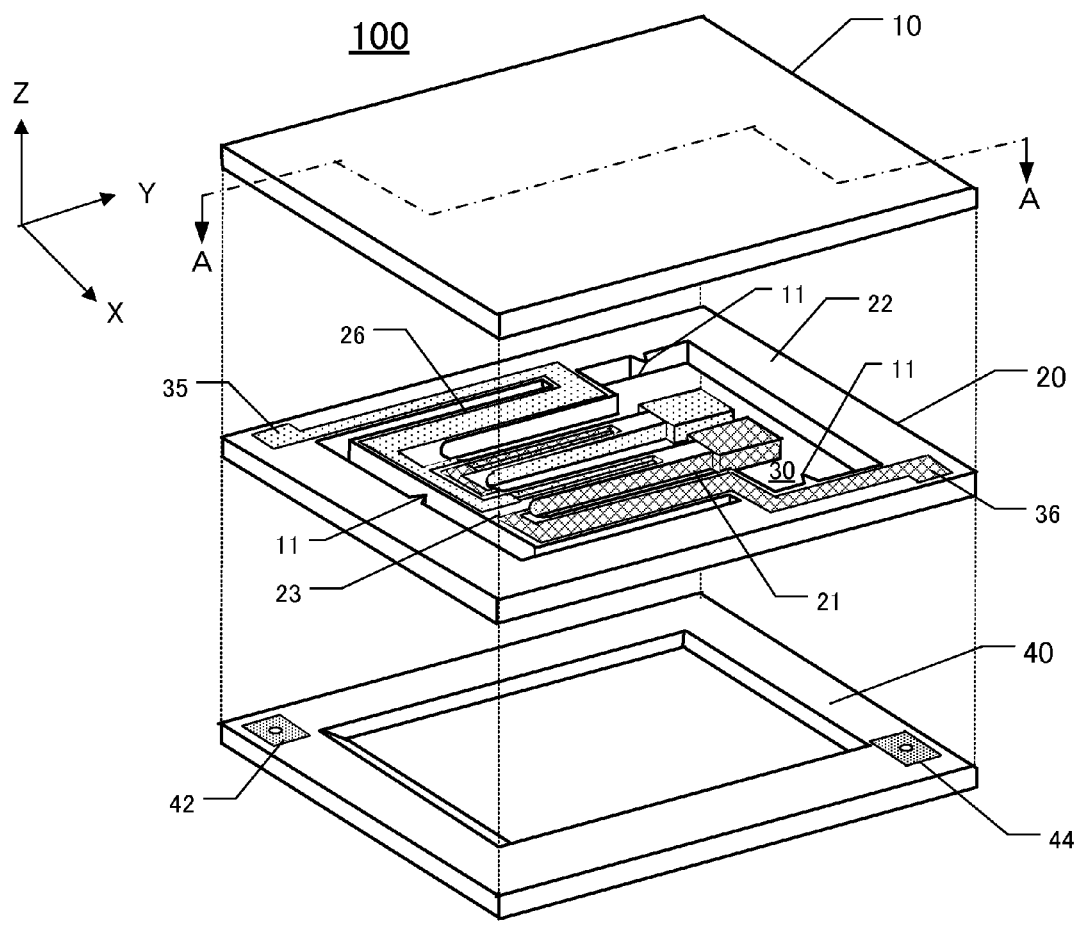
FIG. 1A is a perspective view showing configuration of a piezoelectric device 100 of present invention.
Figure 1B:
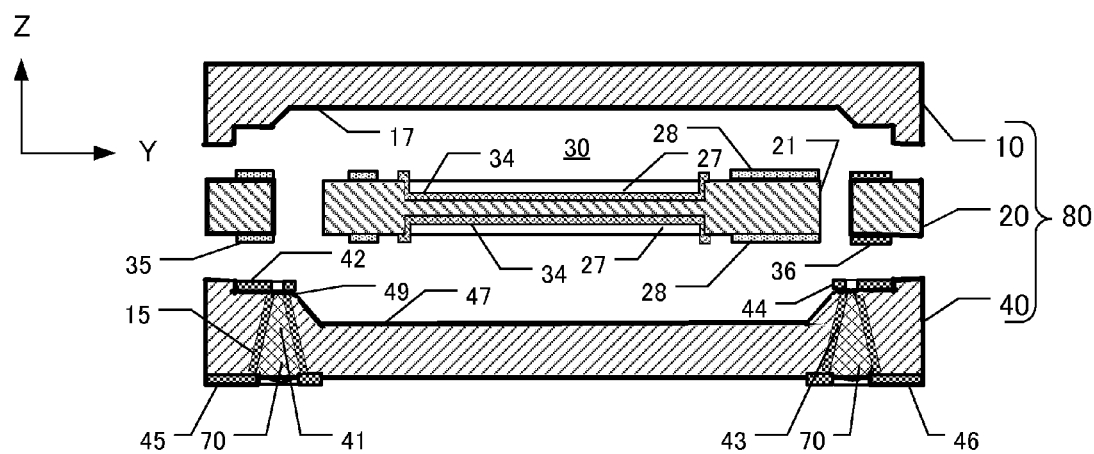
FIG. 1B is a schematic-cross-sectional view taken from A-A line of FIG. 1A and showing that the piezoelectric device 100 is separated as each part.

FIG. 1A is a perspective view showing configuration of a piezoelectric device 100 according to aspects of the present disclosure. FIG. 1B is a schematic-cross-sectional view taken from A-A line of FIG. 1A and showing that the piezoelectric device 100 is separated as each part. The piezoelectric device 100 is comprised of a lid plate 10, a first crystal frame 20 comprising a tuning-fork type crystal vibrating piece 30, and a base plate 40. These lid plate 10, the first crystal frame 20, and the base plate 40 are made of single crystal wafers and form a package 80. FIG. 1A shows the piezoelectric device 100 which is a surface-mount device type and seen from the lid plate 10 side. The base plate 40 is provided with a first and second external electrode 45 and 46 on the bottom. The tuning-fork type crystal vibrating piece 30 of the first crystal frame 20 comprises an outer frame portion 22 and supporting arms 26. The first crystal frame 20 comprises a first and second connecting terminal 35 and 36 on both surfaces of the outer frame portion 22. The outer frame portion 22 is provided with a projection 11 with a first acute angle.

As shown in FIG. 1B, the lid plate 10 comprises a concavity 17 that faces the first crystal frame 20. The base plate 40 comprises a concavity 47 that faces the first crystal frame 20. The base plate 40 also provided with a through-hole 41 and 43, and a first connecting electrode 42 and a second connecting electrode 44. The first connecting electrode 42 is connected to a first external electrode 45 formed on the bottom of the base plate 40 via a through-hole wiring 15 formed in the through-hole 41. The second connecting electrode 44 is connected to a second external electrode 46 formed on the bottom of the base plate 40 via a through-hole wiring 15 formed in the through-hole 43.

A first connecting terminal 35 and a second connecting terminal 36 formed on the lower surface of the outer frame portion 22 of the first crystal frame 20 are connected to the first connecting electrode 42 and the second connecting electrode 44 formed on the upper surface of the base plate 40 respectively. That means that the first connecting terminal 35 is electrically connected to the external electrode 45 and the second connecting terminal 36 is electrically connected to the second external electrode 46.

The piezoelectric device 100 is a device including the first crystal frame 20, the lid plate 10, and the base plate 30. The first crystal frame 20 is sandwiched between the lid plate 10 and base plate 40, which are bonded together to form a packaged device. Bonding of these three plates together can be performed by, for example, siloxane bonding (Si—O—Si). After the siloxane bonding, eutectic alloy 70 comprising gold and other metal is filled to the through-holes 41 and 43 as a sealing material. Then, the package is put into a non-illustrated reflow furnace and the eutectic alloy is melted for sealing and the piezoelectric device 100 is formed.

Configuration of First Crystal Frame 20

FIG. 2 is a top view of the first crystal frame 20 according to aspects of the present disclosure. The first crystal frame 20 comprises the tuning-fork crystal vibrating piece 30 comprising a base portion 23 and vibrating arms 21, an outer frame portion 22 comprising a first extraction electrode 31 and a second extraction electrode 32, and the supporting arms 26, and they are formed in one with same thickness. The tuning-fork type crystal vibrating piece 30 is a very small vibrating piece oscillating a signal in 32.768 kHz.

The first crystal frame 20 is provided with a projection 11 having a first acute angle at a side surface of the outer frame portion 22. The projection 11 takes a form of an acute angle when it is seen from Z-direction. The Z-direction is shown in the Figures as a direction perpendicular to a plane including the crystal frame 20 and tuning-fork crystal vibrating piece 30. The projection 11 having a first acute angle is formed on a side surface of the outer frame portion and faces the tuning-fork crystal vibrating piece 30. In FIG. 2, the projection 11 having a first acute angle formed on the left side is formed within a range from the base portion 23 to the supporting arms 26. The projection 11 having a first acute angle formed on the right side is formed within a range from the vibrating arms 21 to the supporting arms 26. The projection 11 having a first acute angle has an angle in Z-direction. The projection 11 having a first acute angle does not have any effect on oscillation frequency of the tuning-fork type crystal vibrating piece 30. The forming method of the projection 11 having a first acute angle is explained below by referring FIG. 6.

The pair of vibrating arms 21 extends in Y-direction from the base 23 and a respective groove 27 is formed on each of the upper and lower surfaces of each vibrating arm 21 yielding a total of four grooves per pair of vibrating arms 21. A cross-section of a vibrating arm 21 having grooves 27 on the upper and lower surfaces have a substantially H-shaped transverse profile. It would be the same effect that one groove or plurality of grooves can be formed although two of grooves are formed on one vibrating arm.

The distal ends of the vibrating arms 21 become wider with a certain width and form hammer-head portions. On the hammer-head portions, weights 28 comprising metal film are formed. The weights 28 are formed for the vibrating arms to oscillate stably.

On the upper surface of the outer frame 22, the base portion 23, and the supporting arms 26 of the first crystal frame 20, the first and second extraction electrode 31 and 32, and the first and second connecting terminal 35 and 36 are formed. On the lower surface, the same electrodes and terminals are formed. The first and second terminals 35 and 36 formed on the both upper and lower surfaces are conducted at the inner surface of the outer frame portion 22 respectively.

On the upper, lower, and side surfaces of the pair of vibrating arms, 21, a first exciting electrode 33 and a second exciting electrode 34 are formed. The first exciting electrode 33 is connected to the first connecting terminal 35 via the first extraction electrode 31. The second exciting electrode 33 is connected to the second connecting terminal 36 via the second extraction electrode 32. In order to control breaking of wire of extraction electrode caused by flowing of gold in the sealing step of the through-holes by the eutectic alloy 70 (see FIG. 1), wiring having wider width is formed.

The first and second extraction electrode 31 and 32, the first and second exciting electrode 33 and 34, the first and second connecting terminal 35 and 36, and the weights 28 are double layers; a gold (Au) layer of 400 Ångstroms to 2000 Ångstroms is layered on a chrome (Cr) layer of 150 Ångstroms to 700 Ångstroms. Instead of the chrome (Cr) layer, at least one of nickel (Ni), titanium (Ti), aluminum (Al), or tungsten (W) layer can be used. And instead of the gold (Au) layer, a silver (Ag) layer can be used.

The pair of supporting arms 26 extends in Y-direction from the base 23. The pair of supporting arms 26 reduces vibration leakage to external of the piezoelectric device 100 from the vibrating arms 21. Also, an affection of external temperature change or impact force can be reduced. The pair of supporting arms 26 is formed wide in order to support the tuning-fork type crystal vibrating piece 30 securely and not to be broken by impact force. Therefore, a space between the supporting arms 26 and the outer frame portion 22 is very narrow.

On the first crystal frame 20, a profile, the tuning-fork type crystal vibrating piece 30, the outer frame 22, supporting arms 26, and grooves 27 are formed by using a well known photoresist etching technique. The first crystal frame 20 has the projection 11 having a first acute angle on the side surface of the outer frame portion 22. On the first crystal frame 20 on which the profile is formed, electrodes are formed by using a well know photoresist etching technique. After completion of those processes, the first crystal frame 20 shown in FIG. 2 is formed.

SECOND EMBODIMENT

Configuration of Second Crystal Frame 20A

Figure 3:
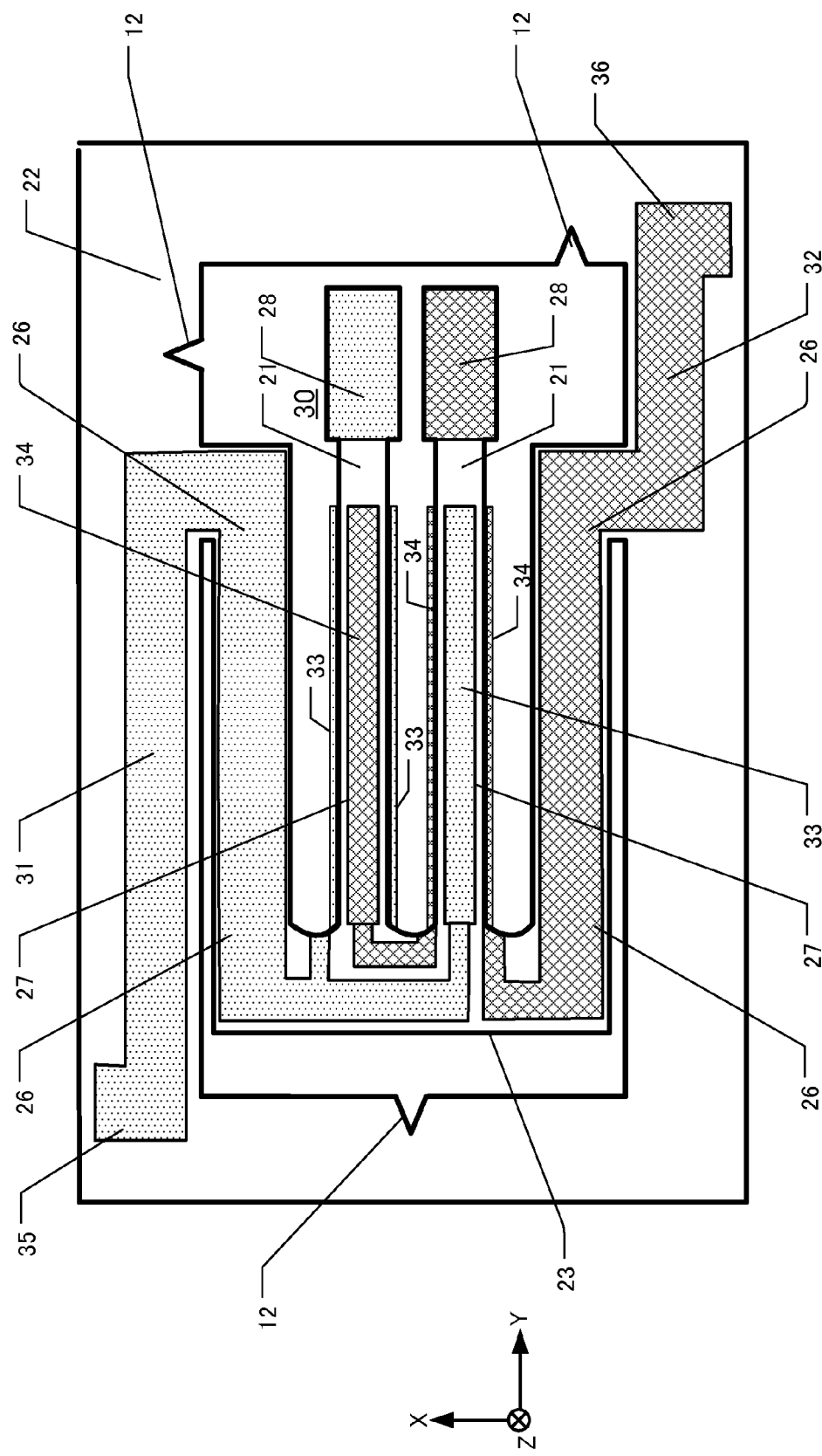
FIG. 3 is a top view of a second crystal frame 20A.

FIG. 3 is a top view of a second crystal frame 20A. A difference between the first crystal frame 20 of the first embodiment and the second crystal frame 20A of the second embodiment is that a concave portion having a first acute angle is formed on the side surface of the outer frame portion 22. The same numberings are used for the same members of the first embodiment and only differences will be explained.

The second crystal frame 20A is provided with a concave portion 12 having a first acute angle at the side surface of the outer frame portion 22. The concave portion 12 takes a form of an acute angle when it is seen from Z-direction. The concave portion 12 having a first acute angle is formed on the side surface of the outer frame portion and faces the tuning-fork crystal vibrating piece 30. In FIG. 3, the concave portion 12 having a first acute angle formed on the left side is formed within a range from the base portion 23 to the supporting arms 26. The concave portion 12 having a first acute angle formed on the right side is formed within a range from the vibrating arms 21 to the supporting arms 26. The concave portion 12 having a first acute angle has an angle in Z-direction. The concave portion 12 having a first acute angle does not have any effect on oscillation frequency of the tuning-fork type crystal vibrating piece 30.

THIRD EMBODIMENT

Configuration of Second Crystal Frame 20B

Figure 4:
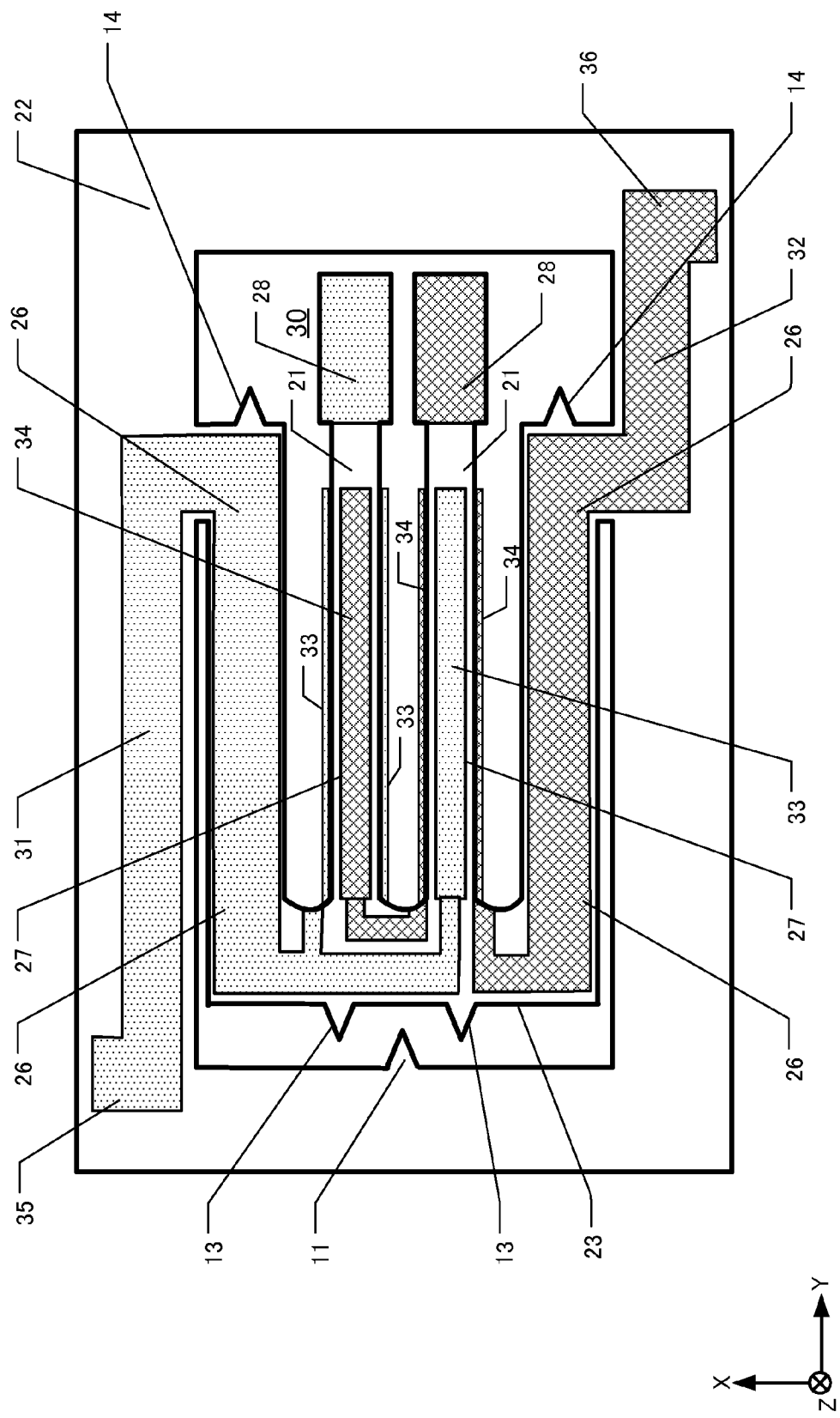
FIG. 4 is a top view of a third crystal frame 20B.

FIG. 4 is a top view of a third crystal frame 20B. A difference between the first crystal frame 20 of the first embodiment and the third crystal frame 20B of the third embodiment is that a projection 13 having a second acute angle and a projection 14 having a third acute angle are formed on the side surface of the base portion 23 and the supporting arm 26. The same numberings are used for the same members of the first embodiment and only differences will be explained.

In FIG. 4, the projections 13 having a second acute angle on the left are formed on the side surface of the base portion 23. Although the projections 13 are formed on the base portion 23, they do not have any effect on oscillation frequency of the tuning-fork type crystal vibrating piece 30. Also, the projections 14 having a third acute angle are formed on the side surface of the supporting arms 26 that face the outer frame portion 22. Although the projections 14 are formed on the supporting arms 26, they do not have any effect on oscillation frequency of the tuning-fork type crystal vibrating piece 30. The projections 13 having a second acute angle and the projections 14 having a third acute angle have angles in Z-direction. Note that a concave portion 12 having an acute angle can be formed instead of the projection 13 or 14.

Manufacturing Steps of Piezoelectric Device 100

Figure 5:
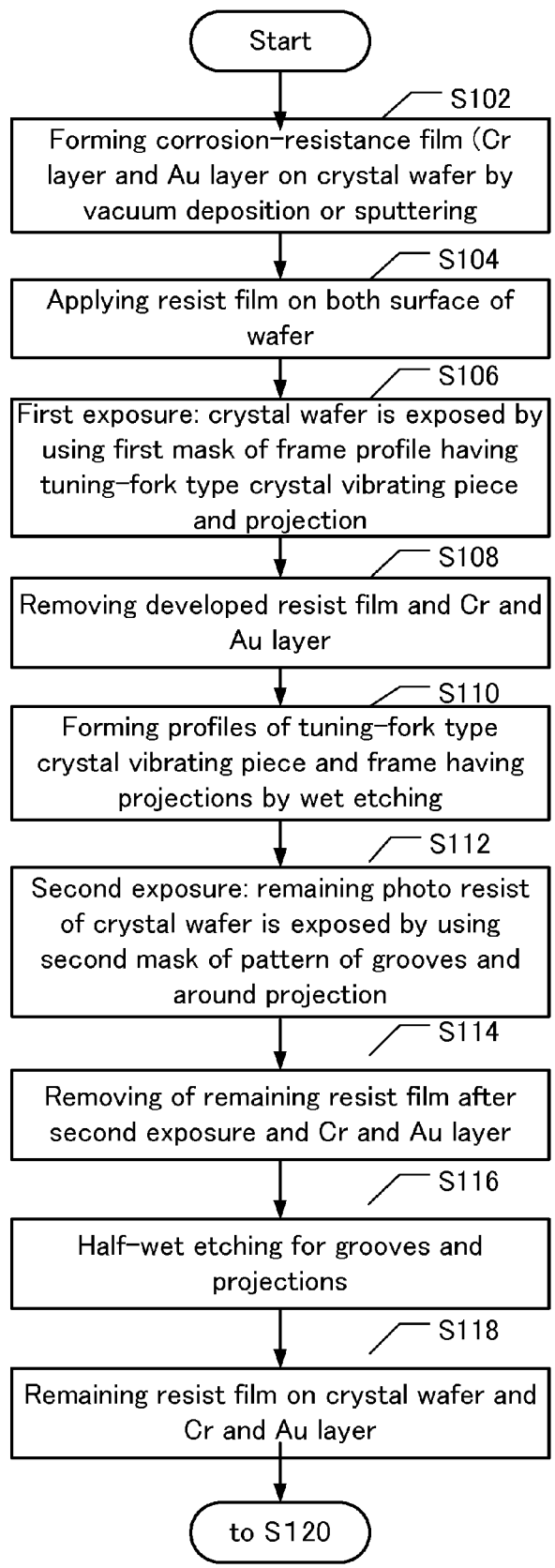
FIG. 5 is a flow chart showing steps of forming of a profile of the first crystal frame 20 and a projection portion 11.
Figure 6:
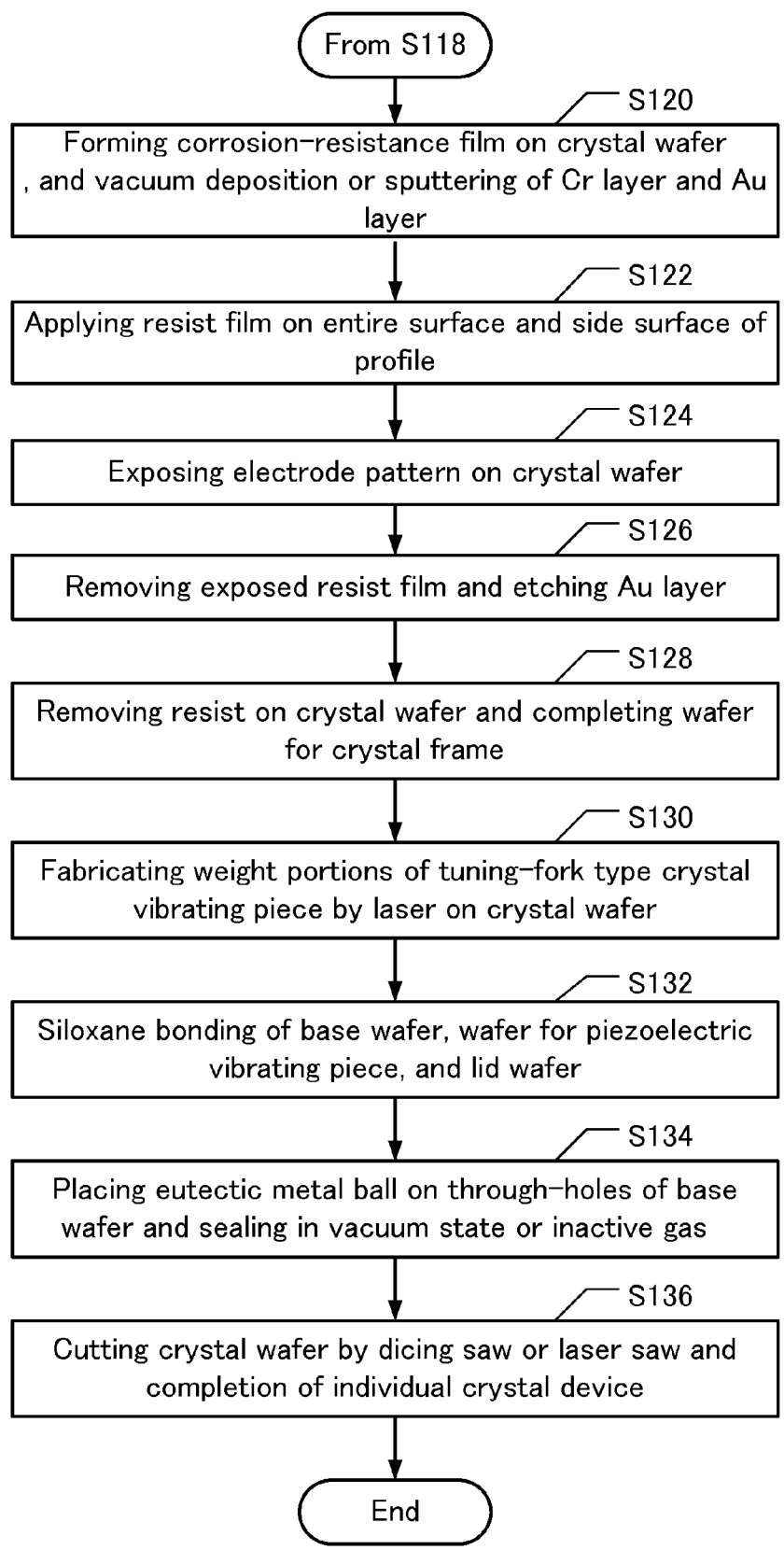
FIG. 6 is a flow chart showing steps of forming electrodes and packaging.

FIG. 5 and FIG. 6 are flow charts showing manufacturing steps of piezoelectric device 100 using the first crystal frame 20 shown in FIG. 2. FIG. 5 is a flow chart showing steps of forming of a profile of the first crystal frame 20 and a projection portion 11. FIG. 6 is a flow chart showing steps of forming electrodes and packaging.

<<Steps of Forming of Profile, Grooves, and Projections of First Crystal Frame 20>>

FIG. 5 is a flow chart showing steps of forming of a profile of the first crystal frame 20 and a projection portion 11.

In step S102, a crystal wafer which is grinded to a designated thickness and of which a surface alteration layer is removed is prepared. A corrosion-resistant film is formed on the entire surface of crystal wafer by a sputtering or deposition method. That is, it is difficult to form a gold (Au) or silver (Ag) layer directly on the crystal wafer as a piezoelectric material; therefore, chrome (Cr) or titanium (Ti) layer is formed as a foundation layer. Thus, in this embodiment, a corrosion-resistance film which a gold layer is layered on a chrome layer is used as a corrosion-resistance film.

In step S104, a photoresist film is applied evenly by spin coating method on the crystal wafer on which a chrome layer and a gold layer are formed previously. For the photoresist film, for example, a photoresist made of novolak resin can be used.

Next in step S106, by using a non-illustrated exposure device, a pattern of a first photo mask 91-1 (see FIG. 8A) for the first crystal frame 20 and the projections 11 is exposed on a first surface of a single crystal wafer on which a photoresist film is applied. To perform wet etching from both side of the single crystal wafer, the same pattern of the first photo mask 91-1 is exposed on a second surface of the single crystal wafer.

In step S108, the pattern-exposed photoresist layer is developed, and the exposed photoresist is removed. Portions of the gold layer now revealed by removal of the exposed photoresist are etched using an aqueous solution of iodine and potassium iodide. Then, portions of the underlying chrome layer revealed by removing corresponding portions of the gold layer are etched using, for example, an aqueous solution of ceric di-ammonium nitrate and acetic acid. The concentrations of these etchants, etching temperature, and etching time are controlled to avoid over-etch. Completion of etching results in complete removal of the corrosion-resistance film from the revealed locations. A structure is thus formed in which the crystal wafer now defines the profile outline of the first crystal frame 20 having the tuning-fork type crystal vibrating piece 30.

In step S110, portions of crystal wafer revealed by removal of the photo-resist film and corrosion-resistance film is etched by using hydrofluoric acid as etchant so as to become a profile of the first crystal frame 20 having the tuning-fork type crystal vibrating piece 30. This wet etching process takes about six to fifteen hours although it may be changed depend on concentration, types or temperature of the hydrofluoric acid. Then, projection profiles 112 shown in FIG. 8C are appeared on the side surfaces of outer frame portion 22.

In step S112, a pattern of a second photo mask 94-1 (see FIG. 8B) for grooves is exposed on the remaining photoresist film of the first surface of the single crystal wafer is exposed. The same pattern is exposed on the second surface as well. This step is called second exposure.

In step S114, exposed photoresist film on the single crystal wafer after the second exposure is removed. Then, gold and chrome layers revealed from the photoresist film are removed.

In step S116, by using fluoric acid solution as an etchant, half-wet etching is performed on the photoresist film and revealed crystal wafer from the corrosion resistance film so as to form grooves.

In step S118, a crystal wafer on which many of the first crystal frames 20 having the tuning-fork type crystal vibrating pieces 30 are formed is achieved by removing unneeded photo-resist film and corrosion-resistance film.

In step S120, the first piezoelectric crystal frame 20 is washed by purified water and then the first chrome layer is formed on the entire surface of crystal wafer by a sputtering or deposition method. The chrome layer and gold layer are formed by vacuum deposition of sputtering method.

In step S122, photoresist is applied on entire surface including grooves 27 and side surfaces by spraying. Because the grooves 27 are formed, the photoresist is applied evenly on the grooves 27 and the side surfaces.

In step S124, a non-illustrated photo mask for electrode pattern corresponding to the electrode pattern is prepared and the electrode pattern is exposed on the single crystal wafer on which the photoresist film is applied. The electrode pattern is exposed on both surfaces of the first crystal frame 20. The first crystal frame 20 has the projection 11 having a first acute angle on the side surface of the outer frame portion 22 and the projection 11 has an angle in Z-direction. Because the projection 11 takes a form of an acute angle, when it is etched in step S110, it becomes complicated shape due to anisotropy of etching of crystal. As a result, exposing light coming in almost vertical to the first and second main surfaces is reflected irregularly. Therefore, despite the exposing light irradiates the side surface of the outer frame portion 22 where the exposing light is not easily come in, the exposing light is reflected to the side surfaces around the projection 11 and the photoresist film formed on the side surfaces are irradiated sufficiently.

In step S126, after developing of the photoresist film, exposed photoresist film is removed. The photoresist film on side surfaces around the projections 11 is exposed so that they are removed. Remaining photoresist film is a photoresist film corresponding to the electrode pattern. Next, a metal film to be an electrode is etched. That is, portions of the gold layer now revealed by removal of the exposed photoresist are etched using an aqueous solution of iodine and potassium iodide. And then portions of the underlying chrome layer revealed by removing corresponding portions of the gold layer are etched using, for example, an aqueous solution of ceric di-ammonium nitrate and acetic acid.

Next in step S128, the photoresist film is removed. After completion of these steps, the extraction electrode 31 and 32, the excitation electrode 33 and 34, and the metal film of weight portion 28 are formed at right positions and with right electrode width.

In step S130, frequency adjustment is conducted to the single crystal wafer in which the first crystal frame 20 is formed. For example, the adjustment is performed by using a non-illustrated femtosecond laser FL to sublime the metal film of weight 28 at the distal end of the vibrating arms 21.

In step S132, each single wafer that the first crystal frame 20, the lid plate 10, and the base plate 40 are formed respectively is bonded by siloxane bonding. That is, bonding surfaces of three single crystal wafers are activated by plasma treating after the surfaces are mirrored or by irradiating ion beam. Correctly aligned and bonded single crystal wafers are impressed while it is heated at 100 C to 200 C. Then, siloxane bonding is completed. As explained with FIG. 1, while the crystal wafers are bonded by siloxane bonding, the first connecting terminal 35 is electrically connected to the first connecting electrode 42 and the first external electrode 45, and the second connecting terminal 36 is electrically connected to the second connecting electrode 44 and the second external electrode 46.

In step S134, ball-shape eutectic alloy 70 is placed on the through-holes 41 and 43 of the siloxane-bonded three single crystal wafers in a vacuum state or inactive gas. With this condition, the wafer is placed into a vacuum reflow furnace and heated for certain time at a designated temperature to melt the eutectic alloy 70. And then the through-holes are sealed by the melted eutectic alloy 70. If the eutectic alloy is Au12Ge alloy, the eutectic alloy is melted at 400 C in a vacuum reflow furnace with a vacuum state or filled with inactive gas. After completion of this process, a piezoelectric device 100 having a package which is a vacuum state or filled with inactive gas is formed.

In step S136, the single crystal wafer where the piezoelectric devices 100 whose package is in a vacuum state or filled with inactive gas are formed is cut into individual piezoelectric device 100 by a dicing saw or laser saw.

<Configuration of Exposure Mask>

FIG. 7 through FIG. 13 are top views showing parts of a first and second photo mask for the first crystal frame 20, the second crystal frame 20A, and the third crystal frame 20B. The first photo mask and the second photo mask have shapes of the projection or the concave portion having a first, a second and a third acute angle.

If the photoresist layer is a negative photo resist, a mask frame 95, a crystal frame pattern 97 having a pattern of a tuning-fork type vibrating piece, a shape of projection, and a shape of a concave portion are transparent areas which are original fused glass, and shaded part 96 is a light shielding area drawn by chrome on fused glass. If the photoresist layer is a positive photo resist, adversely, the shaded part 96 is transparent area. In this embodiment, a negative photo resist is used for explanation. The same numberings for the same members of the first and second photo masks and only differences between the first and second photo mask will be described below.

FIRST EXAMPLE

Figure 7A:
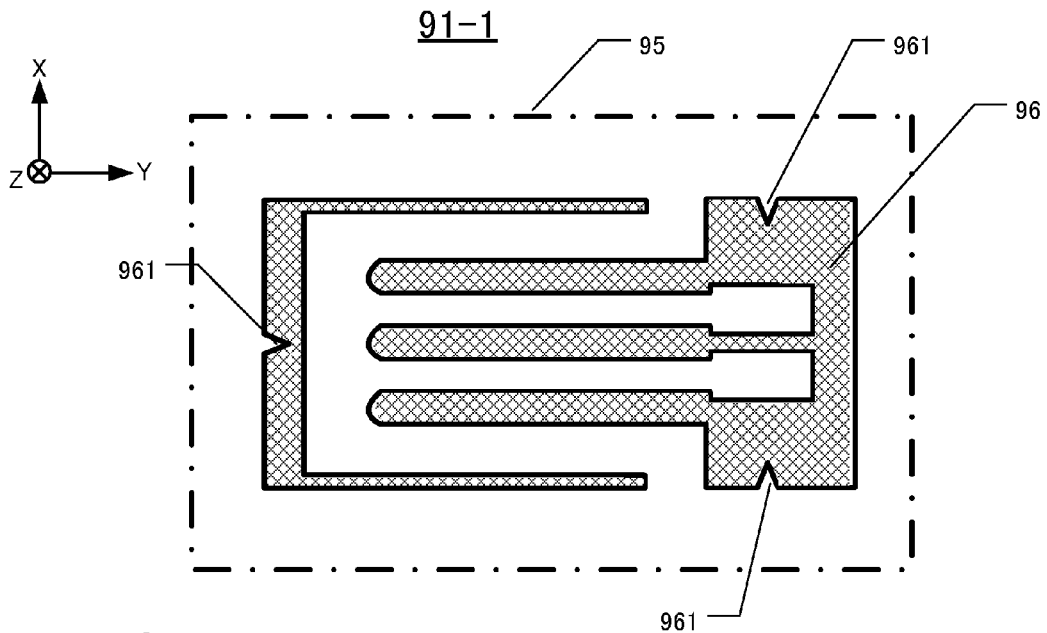
FIG. 7 shows first example: a top view showing a photo mask to form a shape of projection portion 111 of the projection portion 11 and a perspective view of the shape of projection portion 111.
Figure 7B:
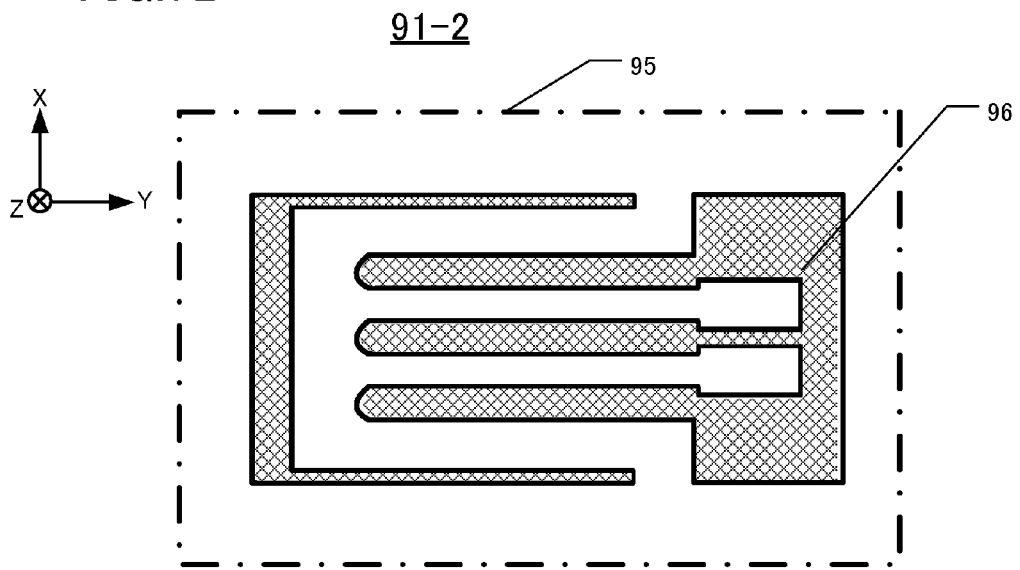

FIG. 7A is a top view showing a first photo mask 91-1 for the profile forming of the first crystal frame 20. For a better understanding, the first photo mask 91-1 shows a profile of the mask frame 95 corresponding to the first crystal frame 20 with dotted line. Light shielding portions corresponding to the tuning-fork type crystal vibrating piece 30 the outer frame portion 22, and the supporting arms 26 of the first crystal frame 20 are drawn on the first photo mask 91-1. A light shielding portion 961 corresponding to the projection 11 having a first acute angle is drawn. A plurality of first crystal frame 20 is drawn and for accurate alignments of the single crystal wafer and the photo mask, alignment marks are drawn on the first photo mask 91-1. FIG. 7B is a top view showing a first photo mask 91-2 for the profile forming of the first crystal frame 20. The tuning-fork type crystal vibrating piece 30, the outer frame portion 22, and the supporting arms 26 of the first crystal frame is drawn on the first photo mask 91-2. But the light shielding portion 961 corresponding to the projection 11 having a first acute angle is not drawn.

Figure 7C:
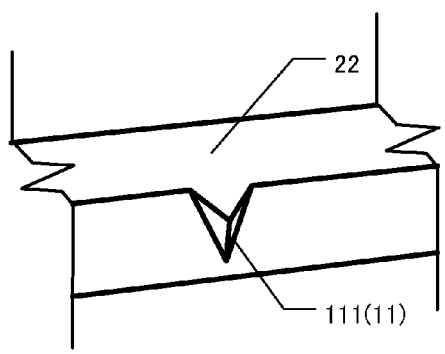

In step S108 shown in FIG. 5, exposure is performed on the first main surface by using the first photo mask 91-1 and on the second main surface by using the second photo mask 91-2. Then in step S110 when wet etching is performed to the single crystal wafer, a shape of projection 111 as shown in FIG. 7C is appeared on the side surface of the outer frame portion 22. Note that actual shape of projection 111 is more complicated shape because of anisotropy of etching of crystal than the shape shown in FIG. 7C. As a result, exposing light coming in almost vertical to the first and second main surfaces is reflected irregularly at the projection 11.

SECOND EXAMPLE

Figure 8A:
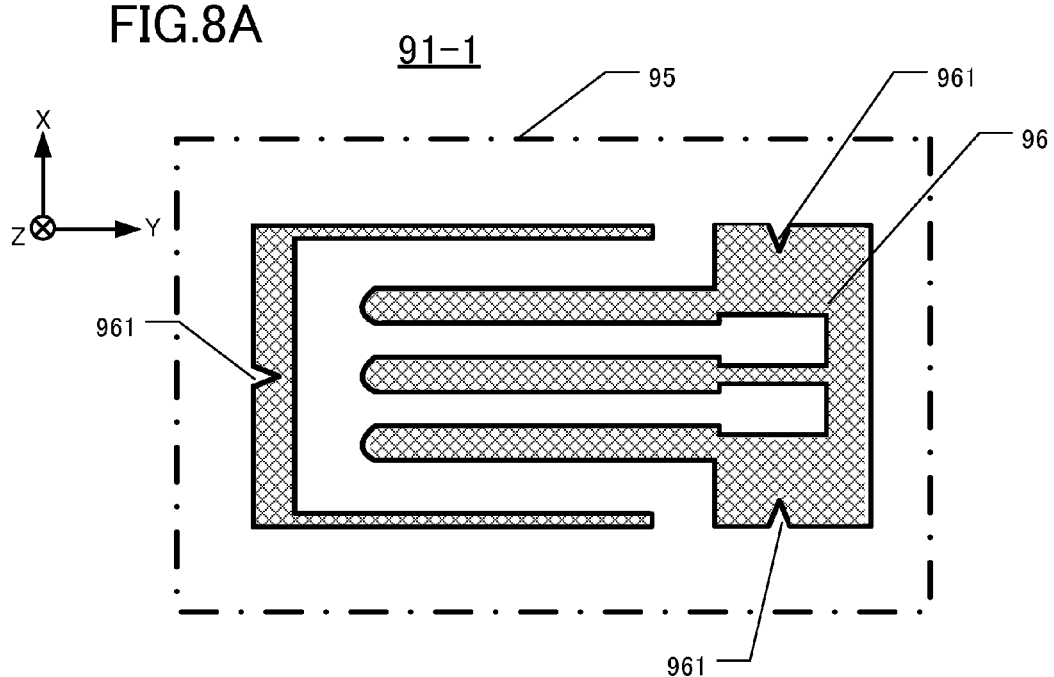
FIG. 8 shows second example: a top view showing a photo mask to form a shape of projection portion 112 of the projection portion 11 and a perspective view of the shape of projection portion 112.

FIG. 8A is a top view showing a first photo mask 91-1 for the profile forming of the first crystal frame 20 and it is the same as the one described with FIG. 7A.

Figure 8B:
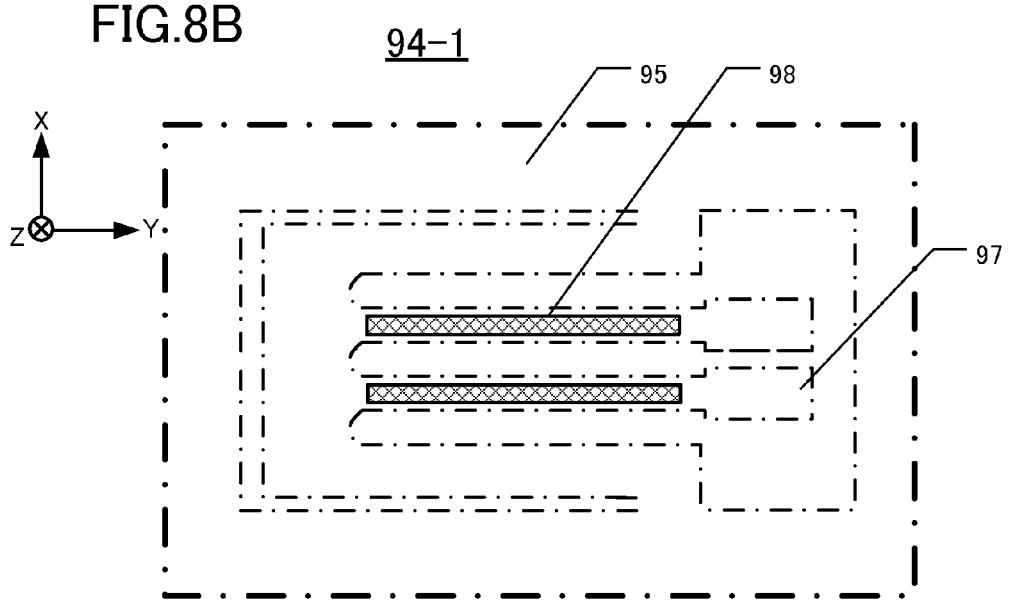
Figure 8C:
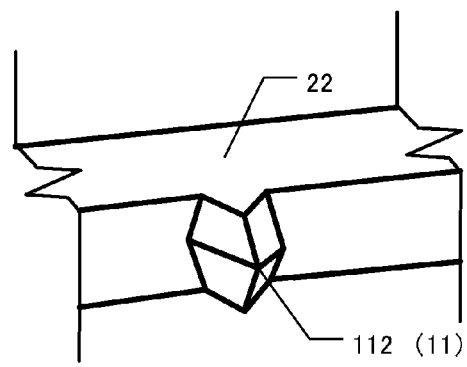

FIG. 8B is a top view showing a second photo mask 94-1 for forming grooves of the first crystal frame 20. Patterns 98 of the groove of the vibrating arms 21 of the tuning-fork type crystal vibrating piece 30 are drawn on the second photo mask 94-1. For a better understanding, the profile of the first crystal frame 20 is illustrated with the crystal frame pattern 97 (dotted line) as well as the profile of mask frame 95.

In step S108 shown in FIG. 5, exposure is performed on the first and second main surfaces by using the first photo mask 91-1. Then in step S110 when wet etching is performed to the single crystal wafer, a shape of projection 112 as shown in FIG. 8C is appeared on the side surface of the outer frame portion 22. Also, in step S112 shown in FIG. 5, exposure is performed on the first and second main surfaces by using the first photo mask 94-1. Then in step S116 when half-wet etching is performed to the single crystal wafer, a shape of grooves 27 of the vibrating arms 21 as shown in FIG. 8C is appeared. In here, the "half-wet etching" means etching that does not fully penetrate the single crystal wafer but etches only half way of the thickness.

THIRD EXAMPLE

Figure 9A:
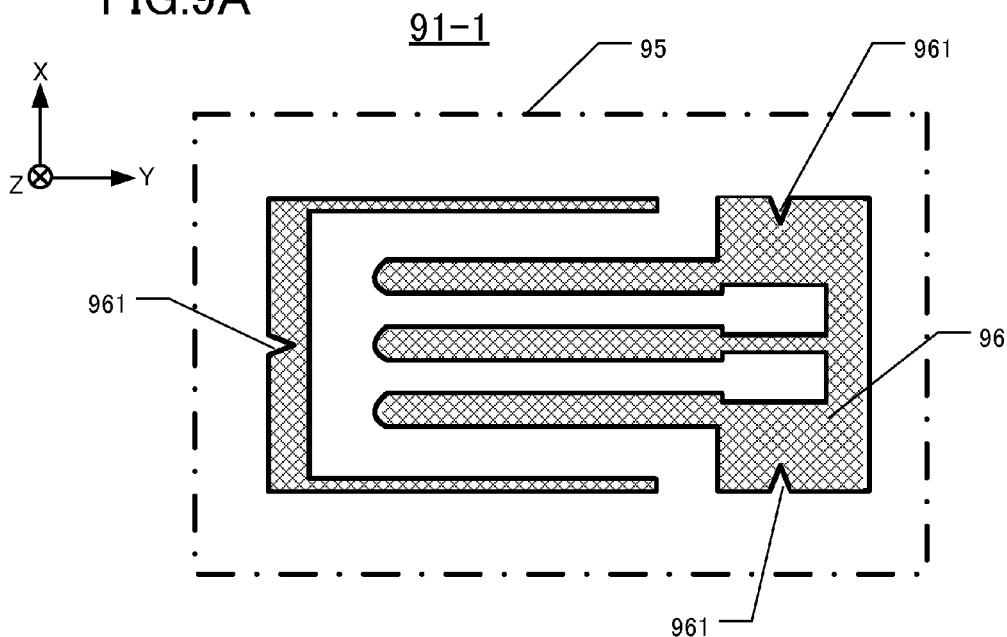
FIG. 9 shows third example: a top view showing a photo mask to form a shape of projection portion 113 of the projection portion 11 and a perspective view of the shape of projection portion 113.

FIG. 9A is a top view showing a first photo mask 91-1 for the profile forming of the first crystal frame 20 and it is the same as the one described with FIG. 7A.

Figure 9B:
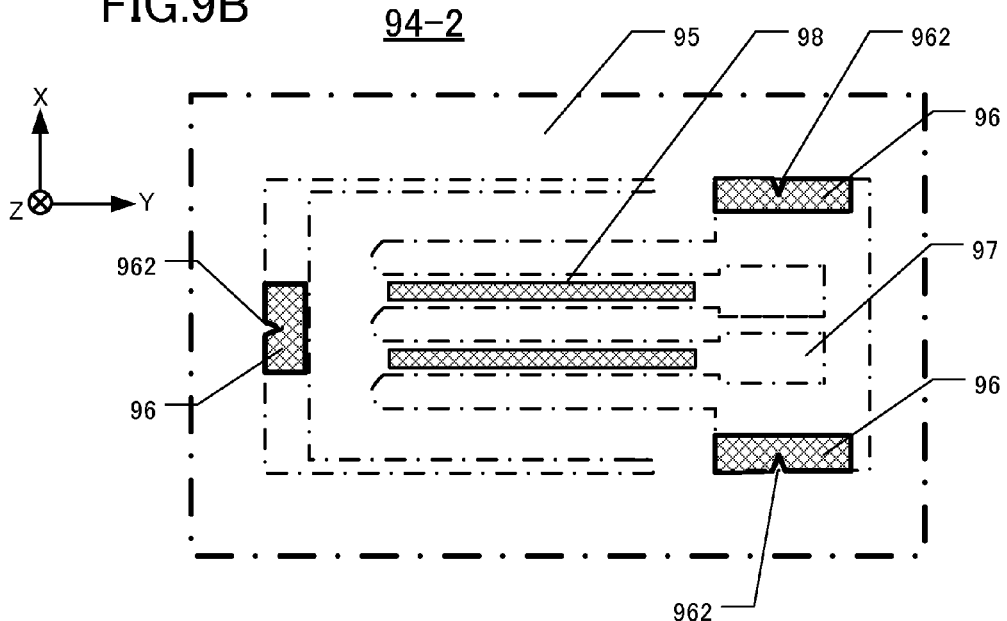

FIG. 9B is a top view showing a second photo mask 94-2 for forming grooves of the first crystal frame 20. Patterns 98 of the groove of the vibrating arms 21 of the tuning-fork type crystal vibrating piece 30 and small light shielding portions 962 corresponding to shapes of projection 11 having a first acute angle are drawn on the second photo mask 94-2. For a better understanding, the profile of the first crystal frame 20 is illustrated with the crystal frame pattern 97 (dotted line) as well as the profile of mask frame 95. Only groove patterns 98 of the vibrating arms 21 of the tuning-fork type crystal vibrating piece 30 are drawn on the second photo mask 94-1, but on the second photo mask 94-2, the small light shielding portions 962 are drawn in addition to the groove pattern 98. The small light shielding portions 962 are smaller than the light shielding portions 961 for projection of the first photo mask 91-1. Due to differences of shape of projections, a slope is formed on the outer frame portion 22 in X-direction in crystal etching step.

In step S108 shown in FIG. 5, exposure is performed on the first and second main surfaces by using the first photo mask 91-1. Then in step S110 when wet etching is performed to the single crystal wafer, a shape of projection 112 as shown in FIG. 8C is appeared on the side surface of the outer frame portion 22. Also, in step S112 shown in FIG. 5, exposure is performed either on the first main surface or the second main surface by the second photo mask 94-2 and the other surface is exposed by using the first photo mask 94-1 as explained in FIG. 8B. Then in step S116 when half-wet etching is performed to the single crystal wafer, a half-etching is further performed on a shape of projection 112. As a result, as shown in FIG. 9C, the projection 113 is formed.

That is, the shapes of projection 113 having complicated profile can be formed at the same time of forming the grooves 27 of the vibrating arms 21.

Figure 9C:
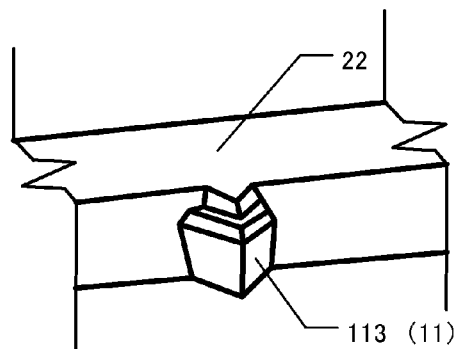

For forming the shape shown in FIG. 9C, either the first main surface or the second main surface is exposed by using the second photo mask 94-2, and the other main surface which is not exposed is exposed by using the second photo mask 94-1. However, the both first and second main surfaces can be exposed by using the second photo mask 94-2. As a result, different profiles of projection than the shape of projection 113 shown in FIG. 9C can be formed.

Further, the shape of projection 113 shown in FIG. 9C can be formed other method described below. The first photo mask 91 having light shielding portions smaller than of the light shielding portion 961 of the first photo mask 91-1 is prepared. In step S108, either one of the first main surface or the second main surface is exposed by using the first photo mask 91-1 and the one which is not yet exposed is exposed by using the first photo mask 91. Then in step S112, either one of the first main surface or the second main surface is exposed by using the second photo mask 94-1 described in FIG. 8B. The profile of projection 113 shown in FIG. 9C also can be achieved by using such exposing method.

FOURTH EXAMPLE

Figure 10A:
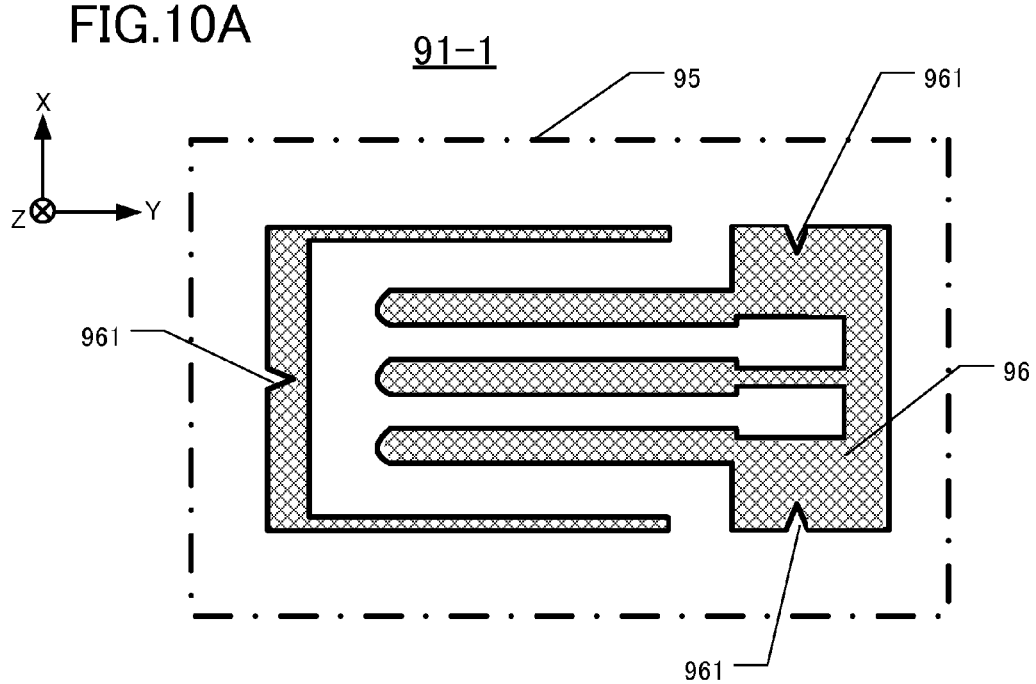
FIG. 10 shows forth example: a top view showing a photo mask to form a shape of projection portion 114 of the projection portion 11 and a perspective view of the shape of projection portion 114.

FIG. 10A is a top view showing a first photo mask 91-1 for the profile forming of the first crystal frame 20 and it is the same as the one described with FIG. 7A.

Figure 10B:
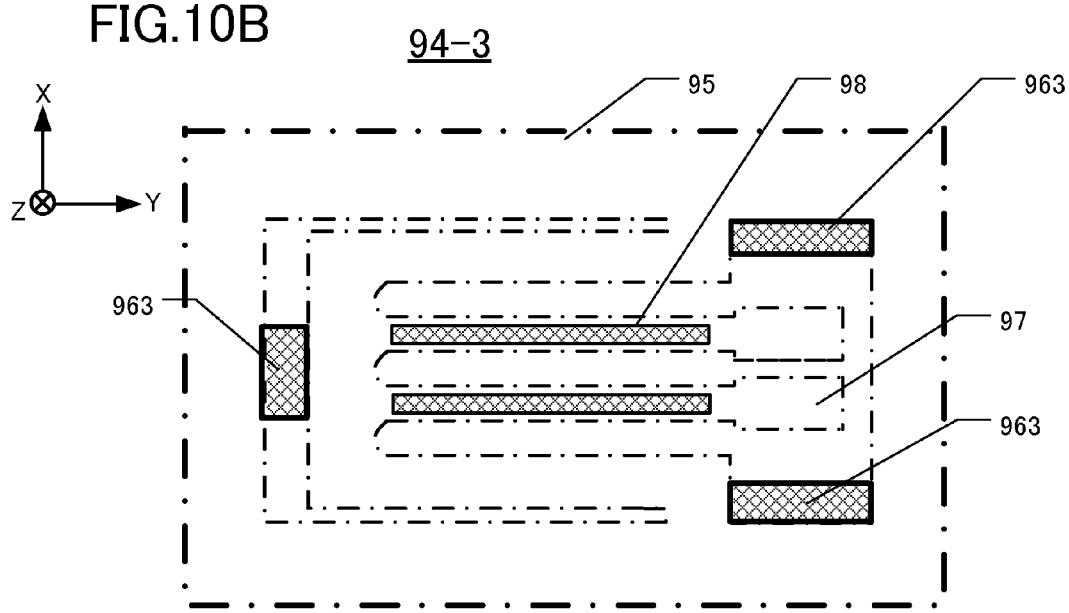

FIG. 10B is a top view showing a second photo mask 94-3 for forming grooves of the first crystal frame 20. The patterns for grooves 98 of the vibrating arms 21 of the tuning-fork type crystal vibrating piece 30 and light shielding portions 963 covering the projection 11 having a first acute angle are drawn on the second photo mask 94-3.

Figure 10C:
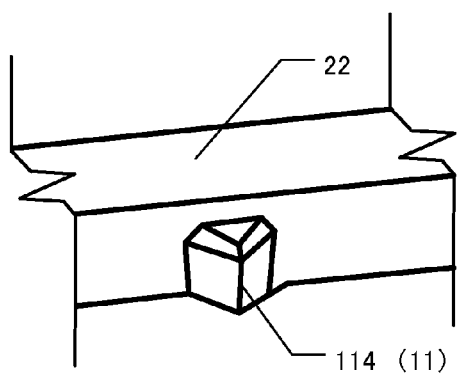

In step S108 shown in FIG. 5, when exposure is performed on the first and second main surfaces by using the first photo mask 91-1 and then in step S110 when wet etching is performed to the single crystal wafer, a shape of projection 112 as shown in FIG. 8C is appeared on the side surface of the outer frame portion 22. Also in step S112 shown in FIG. 5, either one of the first main surface or the second main surface is exposed by using the second photo mask 94-3 and the one that is not yet exposed is exposed by using the second photo mask 94-1 described in FIG. 8B. Then in step when S116 a half-etching is performed to the single crystal wafer, the profile of projection 112 shown in FIG. 8C is also half-etched. As a result, the profile of projection 114 shown in FIG. 10C is formed. The profile of the projection 114 has more complicated profile than the profile of the projection 112 shown in FIG. 8C and thus exposing light coming in almost vertical to the first and second main surfaces is reflected irregularly. The projection shown in FIG. 10C is exposed in step S112 by using the second photo mask 94-2 on either one of the mains surface or the second main surface, and the one that not yet exposed is exposed by using the second photo mask 94-1 described in FIG. 8B. But, both of the first main surface and the second main surface can be exposed by using the second photo mask 94-3.

FIFTH EXAMPLE

Figure 11A:
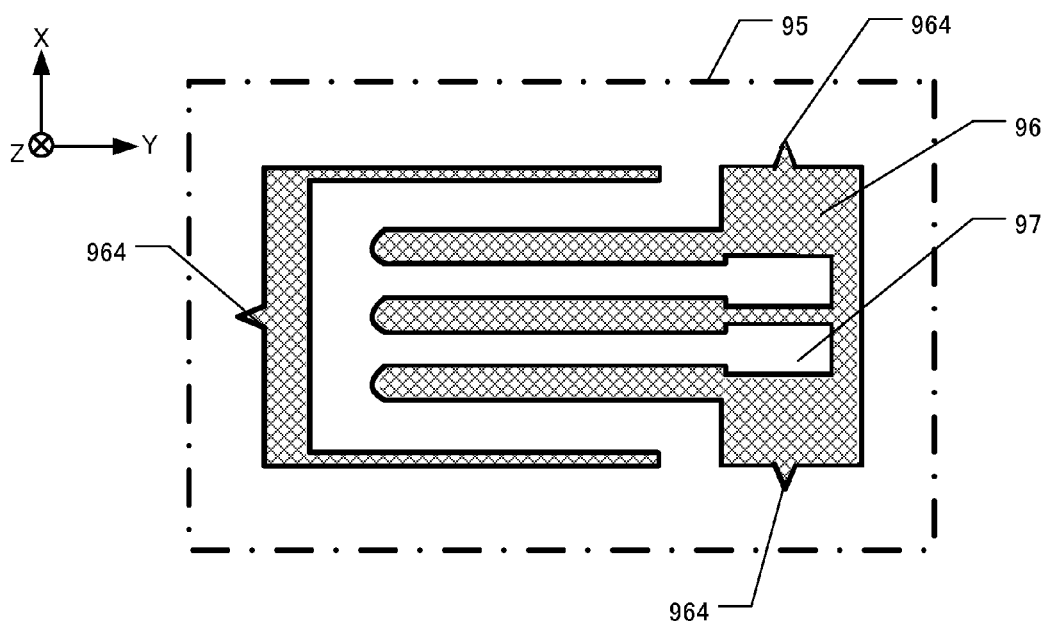
FIG. 11 shows fifth example: a top view showing a photo mask to form a shape of concavity 121 of the concavity 12 and a perspective view of the shape of concavity 121.

FIG. 11A is a top view showing a first photo mask 91-3 for the profile forming of the second crystal frame 20A and it is the same as the one described with FIG. 7A. For a better understanding, the first photo mask 91-3 shows a profile of the mask frame 95 corresponding to the second crystal frame 20A with dotted line. Light shielding portions corresponding to the tuning-fork type crystal vibrating piece 30 of the second crystal frame 20 shown in FIG. 3, the outer frame portion 22, and the supporting arms 26 of the first crystal frame 20 are drawn on the first photo mask 91-3. A light shielding portion 964 corresponding to the concave portion 12 having a first acute angle is also drawn. A plurality of second crystal frame 20A are drawn on the first photo mask 91-1 and alignment marks are drawn for accurate alignments of the single crystal wafer and the photo mask.

Figure 11B:
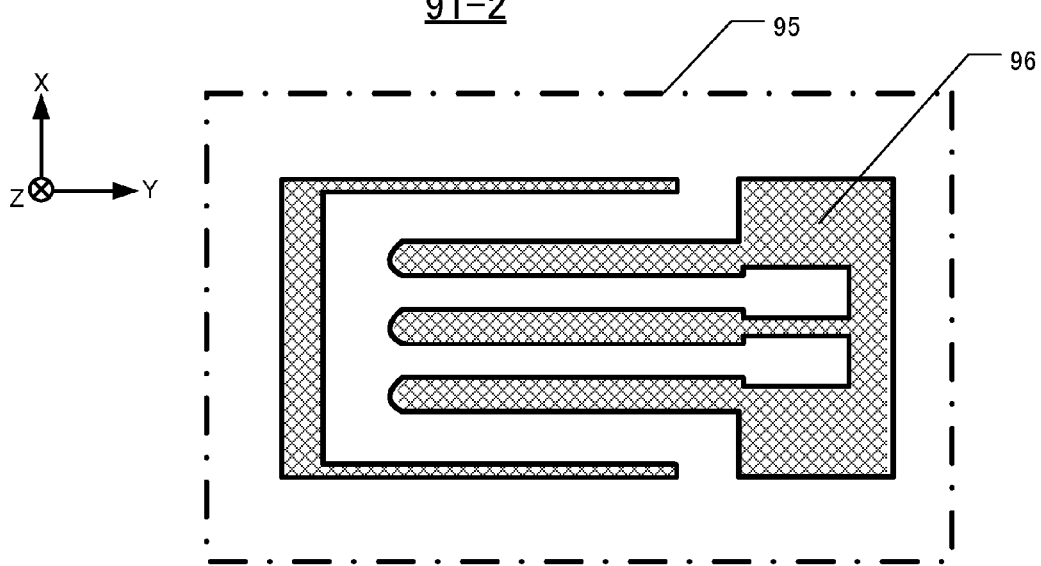

FIG. 11B is a top view showing a first photo mask 91-2 for the profile forming of the second crystal frame 20A and it is the same as the one described with FIG. 7A. Light shielding portions corresponding to the tuning-fork type crystal vibrating piece 30 of the second crystal frame 20, the outer frame portion 22, and the supporting arms 26 of the first crystal frame 20 are drawn on the first photo mask 91-2, but the light shielding portion 964 corresponding to the concave portion 12 having a first acute angle is not drawn.

Figure 11C:
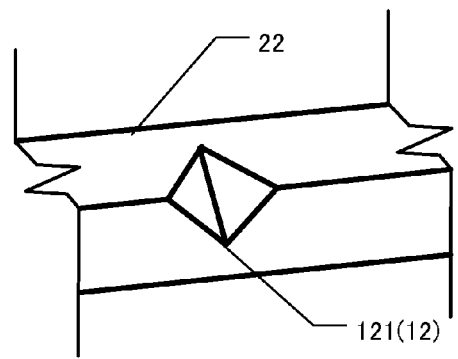

In step S108 shown in FIG. 5, exposure is performed on the first main surface by using the first photo mask 91-3. Then in step S110 when wet etching is performed to the single crystal wafer, a shape of the concave portion 121 as shown in FIG. 11C is appeared on the side surface of the outer frame portion 22. The profile of the concave portion 121 becomes more complicated shape than the one of shown in FIG. 11C due to anisotropy of etching of crystal. Thus exposing light coming in almost vertical to the first and second main surfaces is reflected irregularly at the profile of concave portion 121. Although it is not illustrated, in step S108, both of first main surface and the second main surfaces can be exposed by using the first photo mask 91-3.

SIXTH EXAMPLE

Figure 12A:
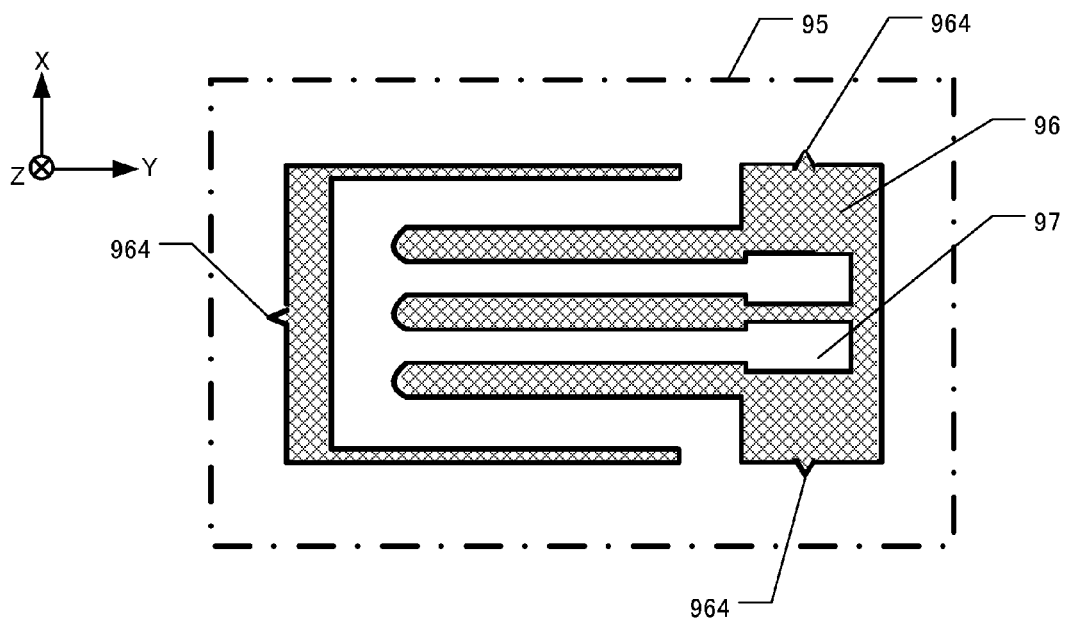
FIG. 12 shows sixth example: a top view showing a photo mask to form a shape of concavity 122 of the concavity 12 and a perspective view of the shape of concavity 121.

FIG. 12A is a top view showing a first photo mask 91-4 for the profile forming of the second crystal frame 20A and it is the same as the one described with FIG. 11A.

Figure 12B:
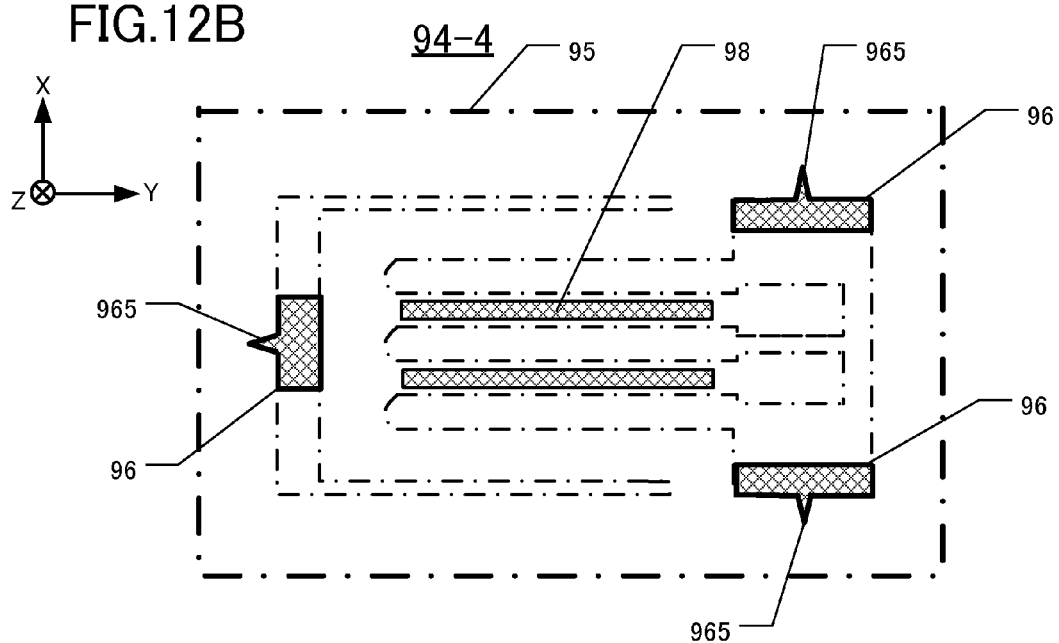

FIG. 12B is a top view showing a second photo mask 94-4 for forming grooves of the second crystal frame 20A. The patterns for grooves 98 of the vibrating arms 21 of the tuning-fork type crystal vibrating piece 30 and light shielding portions 963 covering the projection 11 having a first acute angle are drawn on the second photo mask 94-4. For a better understanding, the profile of the second crystal frame 20A is illustrated with the crystal frame pattern 97 (dotted line) as well as the profile of mask frame 95. On the second photo mask 94-4, the large portion of light shielding portions 965 are drawn in addition to the groove patterns 98. The light shielding portion 965 is larger than of the light shielding portion 961 of the first photo mask 91-4. Due to the size difference of the profiles of concave portion, a slope is formed in Z-direction of the outer frame portion 22 in crystal etching step.

Figure 12C:
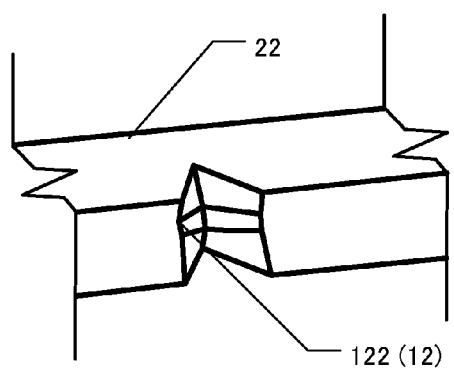

In step S108 shown in FIG. 5, exposure is performed on the first and second main surfaces by using the first photo mask 91-4. Then in step S110 when wet etching is performed to the single crystal wafer, a small shape of the concave portion 121 is appeared on the side surface of the outer frame portion 22. Also in step S112 shown in FIG. 5, the first main surface and the second main surface are exposed by using the second photo mask 94-4. Then in step S116, the single crystal wafer is half etched, the profile of concave portion 122 as shown in FIG. 12C is appeared. In fact, the complicated profile of concave portion 122 can be formed as the grooves 27 of the vibrating arms 21 are formed.

Note that for the concave portion shown in FIG. 12C, in step S112 the first main surface and the second main surface are exposed using 94-4, but either one of the first main surface and the second main surface can be exposed by using the second photo mask 94-4 and the one that is not yet exposed can be exposed by using the second photo mask 94-1.

SEVENTH EXAMPLE

Figure 13A:
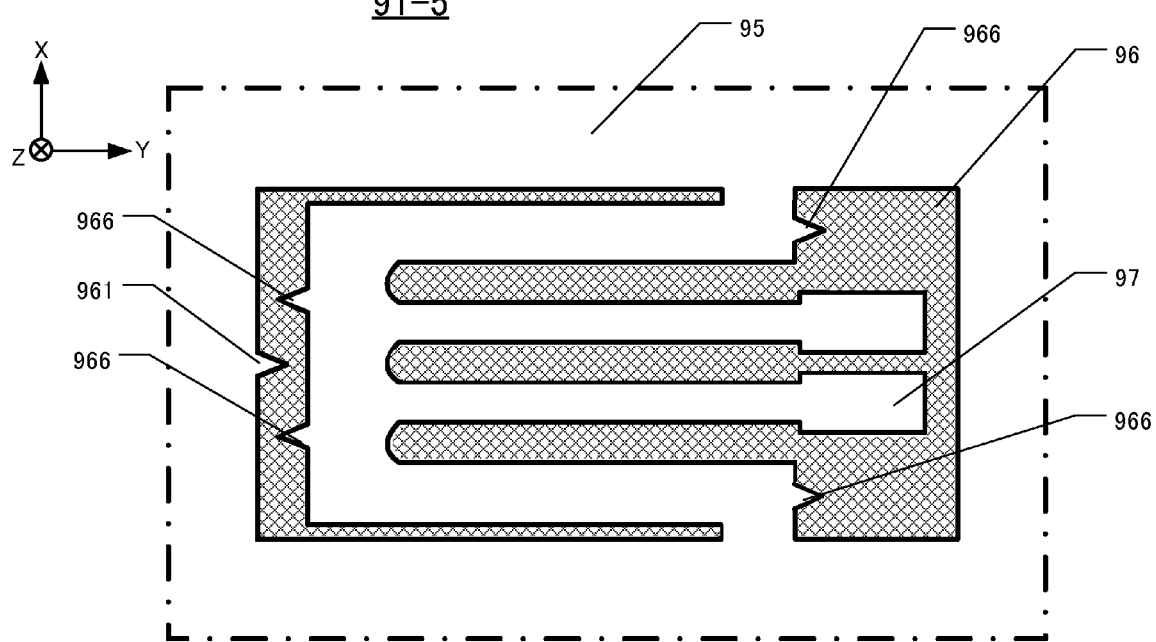
FIG. 13 shows seventh example: a top view showing a photo mask to form a projection portion 13 or 14.

FIG. 13A is a top view showing a first photo mask 91-5 for forming the profile of the third crystal frame 20B. For a better understanding, the profile of the mask frame 95 corresponding to the third crystal frame 20B is illustrated with the dotted line. Light shielding portions corresponding to the tuning-fork type crystal vibrating piece 30, the outer frame portion 22, and the supporting arms 26 of the third crystal frame 20B shown in FIG. 4 are drawn on the first photo mask 91-5. Also, a light shielding portion 961 corresponding to the projection 11 having a first acute angle is drawn and light shielding portions 966 corresponding to the projection 13 and 14 having a second and third acute angles are also drawn. A plurality of third crystal frame 20B are drawn on the first photo mask 91-5, and alignment marks are drawn for accurate alignments of the single crystal wafer and the photo mask.

Figure 13B:
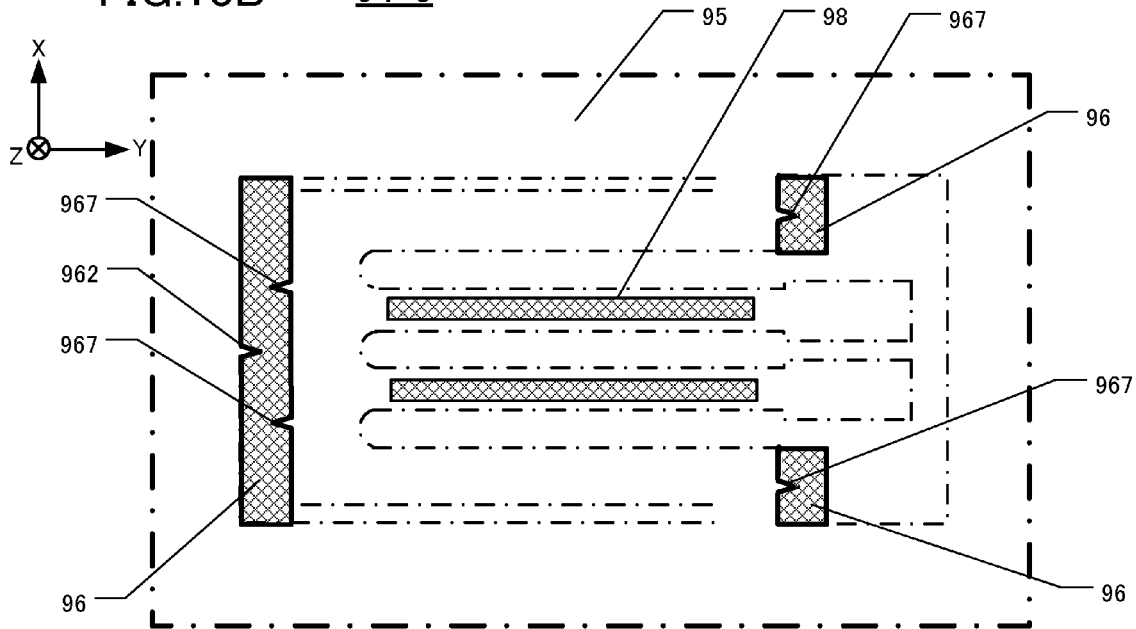

In addition to the groove patterns 98, light shielding portions 962 and 967 and having small projection profiles are drawn on the second photo mask 94-5 shown in FIG. 13B. The size of light shielding portion 962 is smaller than of light shielding portion 966 of the first photo mask 91-5. Due to the size difference of the profiles of concave portion, a slope is formed in Z-direction of the outer frame portion 22 in crystal etching step. Then, the same profile of projection 113 described in the third example (FIG. 9C) is appeared. It is not particularly illustrated, but it is easily to be found by those skilled in the art that combinations of varieties of embodiments enable to form varieties of projections or concave portions.

Piezoelectric frames or piezoelectric devices and manufacturing methods thereof have been described above in the context of preferred embodiments. It will be understood that those of ordinary skill in the art can vary and/or modify the disclosed embodiments. For example, for the first piezoelectric crystal frame 20 having the tuning-fork type piezoelectric vibrating piece 30, various kinds of piezoelectric single crystal materials, such as lithium niobate can be used instead of crystal. Also, in present disclosure, projections or concave portions having a first, second, or third acute angle are formed, but a plurality of projections having saw-toothed shape or wave shape can be arranged.

What is claimed is:

1. A piezoelectric frame comprising:
   a tuning-fork type piezoelectric vibrating piece having a pair of vibrating arms extending from a base portion having an upper surface, a lower surface and side surfaces, and respective excitation electrodes formed on the vibrating arms;
   an outer frame having an upper surface, a lower surface and side surfaces, the outer frame surrounding the tuning-fork type piezoelectric vibrating piece;
   a pair of supporting arms each supporting arm having an upper surface, a lower surface and side surfaces, the supporting arms extending from the base portion to the outer frame portion and supporting the tuning-fork type piezoelectric vibrating piece; and
   an acute angle portion formed on at least one of a side surface of the outer frame facing the tuning-fork type piezoelectric vibrating piece, a side surface of the outer frame facing the supporting arms or a side surface of the outer frame facing the base portion, wherein the acute angle portion comprises an acute projection having projection side surfaces meeting at a tip and forming an acute angle when viewed from a direction normal to the upper surface and lower surface of the outer frame, said projection side surfaces formed at an angle relative to the normal direction.

2. A piezoelectric device comprising:
   the piezoelectric frame of claim 1,
   a lid covering the piezoelectric frame; and
   a base supporting the piezoelectric frame and including an external electrode electrically connecting to a connecting electrode, the connecting electrode extending from the excitation electrode to the outer frame portion through the supporting arms.

* * * * *